United States Patent [19]

Allison et al.

[11] Patent Number: 5,118,153
[45] Date of Patent: Jun. 2, 1992

[54] HAND-OPERATED RECIPROCATING BELLOWS FOR ELECTRONIC COMPONENT PICKUP

[75] Inventors: Quincy D. Allison, Boulder Creek; Howard W. Hendricsen, Los Altos, both of Calif.

[73] Assignee: H-Square Corporation, Sunnyvale, Calif.

[21] Appl. No.: 665,326

[22] Filed: Mar. 6, 1991

[51] Int. Cl.⁵ .............................................. B66C 1/02
[52] U.S. Cl. .................................... 294/64.1; 294/131
[58] Field of Search .................. 294/64.1, 131; 29/743

[56] References Cited

U.S. PATENT DOCUMENTS

| | | | |
|---|---|---|---|
| 1,302,028 | 4/1919 | Fuchs et al. | 294/64.1 |
| 3,071,402 | 1/1963 | Lasto et al. | 294/64.1 |
| 3,335,727 | 8/1967 | Spoto | 294/64.1 X |
| 3,529,760 | 9/1970 | Hickman et al. | 228/51 |
| 3,608,946 | 9/1971 | Erickson | 294/64.1 |
| 3,618,846 | 11/1971 | Poll | 294/64.1 X |
| 3,934,916 | 1/1976 | Baker | 294/64 R |
| 4,564,188 | 1/1986 | McNair | 294/64.1 X |
| 4,620,637 | 11/1986 | Schwartz et al. | 294/64.1 |
| 4,822,278 | 4/1989 | Oliva et al. | 294/64.1 X |
| 4,917,427 | 4/1990 | Scaglia | 294/64.1 |

FOREIGN PATENT DOCUMENTS

| | | | |
|---|---|---|---|
| 2628488 | 5/1978 | Fed. Rep. of Germany | 294/64.1 |
| 2704981 | 5/1978 | Fed. Rep. of Germany | 294/64.1 |
| 58589 | 5/1977 | Japan | 294/64.1 |
| 39874 | 4/1978 | Japan | 294/64.1 |
| 33678 | 3/1979 | Japan | 294/64.1 |
| 6385 | of 1909 | United Kingdom | 294/64.1 |
| 2032830 | 5/1980 | United Kingdom | 294/64.1 |

*Primary Examiner*—Margaret A. Focarino
*Assistant Examiner*—Joseph D. Pape
*Attorney, Agent, or Firm*—Schneck & McHugh

[57] ABSTRACT

A hand-held surface mount pick having a handle and a bellows. The handle includes a vacuum passageway with an evacuation opening at a first end and a plurality of closely spaced vents along an intermediate region. At an end opposite to the evacuation opening is a fitting for attachment to a source of vacuum. The bellows is connected to the first end and is in fluid communication with the vacuum source via the fitting and in fluid communication with the ambient atmosphere via the vents. A protective shield is coupled to the handle at the first end. The bellows has a relaxed condition in which a portion of the bellows extends beyond the protective shield to contact an electronic component. Upon contact with the component, the vents are covered by the finger of a user, thereby creating a vacuum within the bellows to draw the component into the protective shield. In a second embodiment, the pressure differential within the bellows is created by compressing the bellows against a component, whereafter one or more vent is covered.

18 Claims, 3 Drawing Sheets

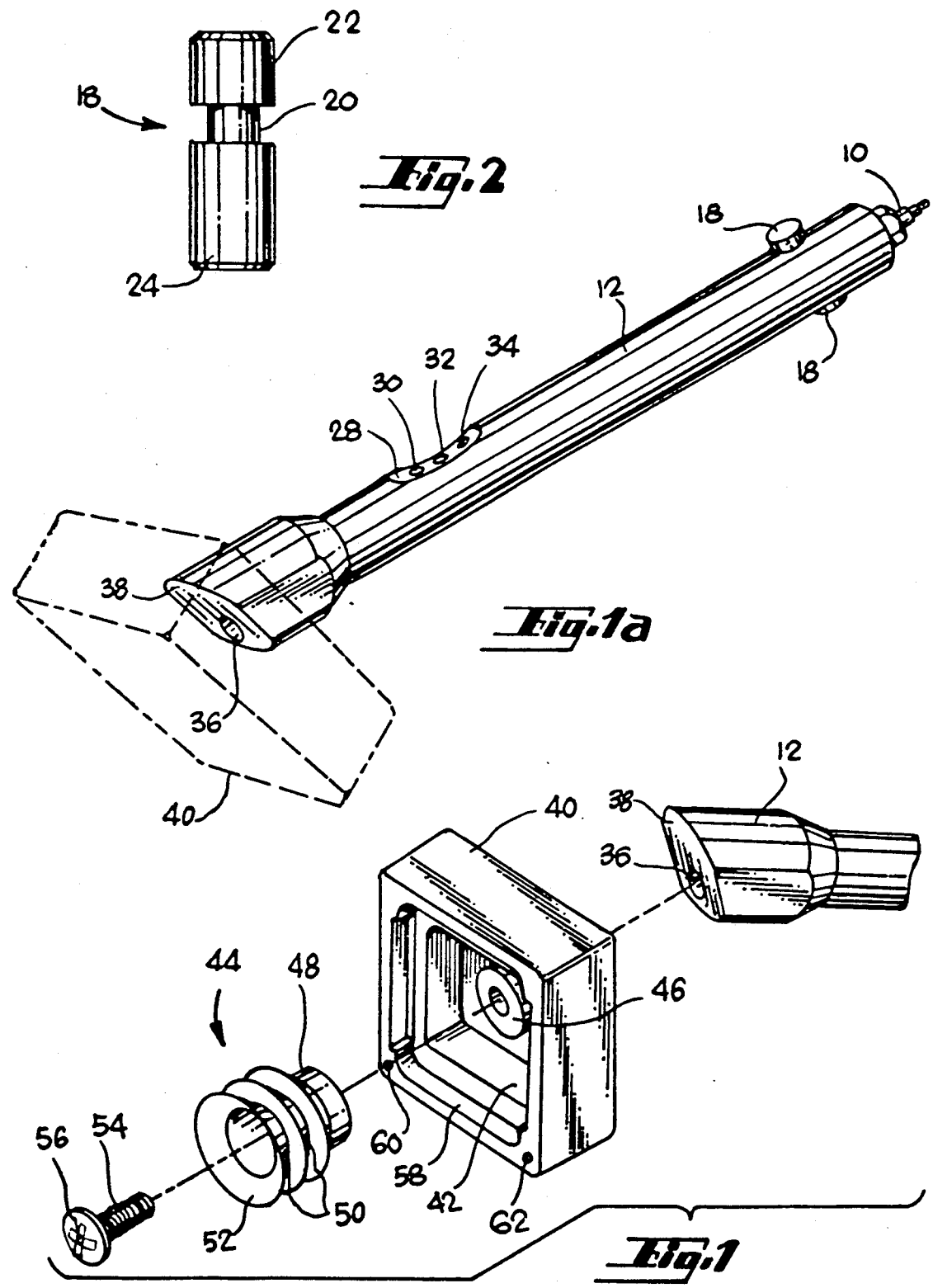

HAND-OPERATED RECIPROCATING BELLOWS FOR ELECTRONIC COMPONENT PICKUP

DESCRIPTION

1. Technical Field

The present invention relates to pickup tools for handling electronic components and particularly to vacuum picks for surface mounting electronic components.

2. Background Art

In the interconnection of electronic components to assemble electronic devices, the component handling must be performed swiftly but carefully. Electronic components typically include a number of leads which are easily bent by inadvertent contact with a fixed object. Moreover, components may be rendered inoperable by the release of a static charge onto the leads of the component.

A number of devices had been used in the handling of fragile, miniature electronic components. For example, U.S. Pat. No. 3,529,760 to Hickman et al. teaches a flatpack installation and removal tool which grips a flatpack and solders it to a printed circuit board. Flatpacks are packages for integrated circuitry and include leads projecting from opposed sides. As described in the Hickman et al. patent, the typical flatpack may have 10, 12 or 14 leads in the form of flat ribbons and comprise a silicon circuit chip disposed in the shallow cavity of a square of hard glass through which the ribbon-like leads are fused. The Hickman et al. tool includes a resilient clamping member which is pivoted in response to activation of a thumb-operated mechanism to cooperate with a fixed clamping member.

In addition to the clamping devices such as Hickman et al., vacuum-operated devices are also employed in component handling. U.S. Pat. No. 4,620,637 to Schwartz et al. teaches a vacuum pick for transferring semiconductor wafers to and from a cassette holder. The vacuum pick includes a housing having a wafer support surface and a rigid chuck mounted on a flexible member to permit movement of the chuck relative to the housing. The chuck is designed to tilt relative to the housing when it contacts a tilted wafer, thereby ensuring reliable attachment to the wafer. Another pickup device which incorporates tilting is described in U.S. Pat. No. 3,934,916 to Baker. The Baker patent teaches use of collapsible suction cups with anti-collapse stiffening means on one side of the cups to automatically tilt an article. The Baker patent does not teach use in the electronics industry. Rather, the tilting device is used in the food packaging industry. Moreover, Baker teaches use of the suction cups in assembly line procedure. Thus, a gentle release is possible by providing a controlled release of vacuum to the suction cup.

A controlled release of vacuum is more difficult if used with hand-held tools. Typically, hand-held tools have an on-off valve which releases a captured component. The on-off feature provides immediate release, rather than a more desirable gentle release of a component. The gentle release of an electronic component is particularly desirable in the use of a hand-held tool for surface mounting a component to a printed circuit board or the like.

In addition to gentle release, a second desirable characteristic of a component transferring device involves component protection. As noted above, a flatpack includes leads which extend from opposite sides of a package. During movement of the device which secures a flatpack, the leads may inadvertently collide with an object. Protecting the leads during movement of the component can prevent damage to valuable devices.

It is an object of the present invention to provide a hand-held and finger-actuated device for transferring electronic components wherein the user is able to control the release and wherein the component is protected during transport.

Summary of the Invention

The above object has been met by a transfer device which allows finger-controlled movement of an electronic component by selectively blocking air flow through one or more vents. Preferably, the vents are an array of openings which are closely spaced to permit complete coverage by a user's finger. Location of the vents within an area of one square inch is preferred. The device includes a bellows having a plurality of folds which allow the bellows to axially contract in response to pressure differential. The pickup end of the bellows may be brought into contact with an electronic component, whereafter blocking of the vents causes the bellows to contract to bring the component within a shield which provides protection of the component.

The hand-held device includes a handle having an interior vacuum passageway. The handle is generally cylindrical and includes an evacuation opening at a first end. The bellows is coupled to the handle at the first end and the interior of the bellows is in fluid communication with the evacuation opening. The vents are disposed at an intermediate region of the handle and are in fluid communication with the evacuation opening via the vacuum passageway. Thus, a vacuum within the bellows can be released merely by allowing air flow through the vents.

In the preferred embodiment, the end of the handle opposite to the evacuation opening has a fitting which links a source of vacuum to the vacuum passageway of the handle. Pressure for picking up a component may be created by blocking the vents so that air is extracted from the bellows which is in contact with the component. As air is extracted, the bellows contracts, carrying the component into the protective shield which is attached to the first end of the handle. The component can then be transferred in a protected condition. Upon reaching a desired destination, the component may be released by movement of the user's finger out of blocking relation with the vents. Preferably, the user moves the finger forwardly or rearwardly to expose the vents to the ambient atmosphere on a one-by-one basis. In this manner, the component is not abruptly released, but instead is released gently.

An advantage of inclusion of a bellows in a hand-held device is that an electronic component may be displaced merely by evacuating the bellows, so that the bellows is responsible for moving the component into a position in which it is protected. That is, the collapse of the bellows carries the component into the protected shield. Another advantage of the present invention is that the device is easily manipulated. The device fits within the hand of a user and is controlled by movement of a finger. Inclusion of a plurality of vents which are selectively blocked by the user's finger permits a controlled release of vacuum pressure, preventing an abrupt movement of the component upon reaching the desired destination. Another advantage to inclusion of a plurality of vents is that the vacuum pressure at the individual vents does not create a significant pull to the skin of the user. A single vent having a diameter sufficiently large to effectively release the bellows from a contracted condition could cause discomfort to the user over a period of time. Likewise, the array of vents is less likely to pull glove material into the vent holes for those users who employ the use of gloves during handling.

BRIEF DESCRIPTION OF THE DRAWINGS

FIG. 1 is an exploded view of a surface mount pick in accord with the present invention.

FIG. 1a is a perspective view of the handle of FIG. 1 having the protective shield shown in phantom.

FIG. 2 is a side view of a valve member of FIG. 1.

BEST MODE FOR CARRYING OUT THE INVENTION

Figure 3:
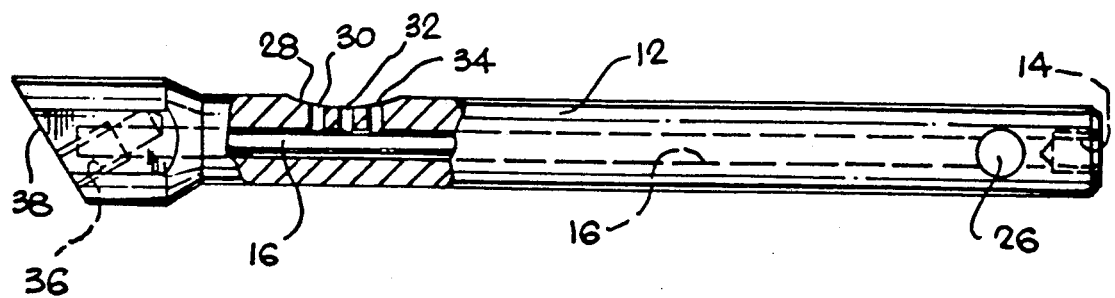
FIG. 3 is a side, partially sectional view of the handle of FIG. 2.

With reference to FIGS. 1-3, a surface mount tool is shown as including a fitting 10 attached to a cylindrical handle 12. The fitting 10 includes a plurality of regions which are increased in diameter to ensure snug fit with a hose, not shown, connected to the source of vacuum. For example, a hose may be used to link the exterior portion of the fitting to a house vacuum source of an electronic component fabrication facility.

An end portion of the fitting 10 is externally threaded and fits within an internally threaded opening at the back of the handle 12. The internally threaded opening 14 which receives the fitting is best seen in FIG. 3. The fitting has a central bore which allows fluid communication between the vacuum source, not shown, and a vacuum passageway 16 through the handle 12. Vacuum pressure to the forward portion of the vacuum passageway 16 can be obstructed by movement of a valve member 18. As shown in FIG. 2, the valve member includes a reduced diameter region 20 which spaces apart a first end portion 22 from an elongated second end portion 24. The valve member 18 functions as a slide switch within a transverse bore 26 shown in FIG. 3. When the reduced diameter region 20 of the valve member is aligned with the vacuum passageway 16 through the handle 12, air will flow through the passageway for exit from the rear opening 14. The elongated end portion 24 of the valve member has a diameter greater than the diameter of the vacuum passageway 16. Thus, when the valve member is pressed to a position in which the elongated end portion 24 is aligned with the vacuum passageway, air flow is obstructed. The valve member is pressed into the position to obstruct air flow when the surface mount pick is not in use for an extended period of time.

As shown in FIGS. 1 and 3, the handle 12 includes a recess 28 having three vents, 30, 32 and 34. The vents 30-34 allow fluid communication between the vacuum passageway 16 and the ambient atmosphere. At the forward end of the handle 12 is an evacuation opening 36 which extends to the vacuum passageway 16. The face 38 of the handle 12 is at a 60° angle relative to the handle axis, but this is not critical. Optionally, the face 38 may be perpendicular to the handle axis, or may be at any other desired angle.

Fixed to the face 38 of the handle 12 is a protective shield 40. The protective shield is shown in phantom in FIG. 1a. The shield has a first internal surface 42 that defines a cubic volume having a cross sectional area sufficient to receive a bellows 44. The bellows 44 is snug fit to a cylindrical projection 46 of the protective shield.

The bellows 44 includes an annular hand 48 which is coupled to the cylindrical projection 46 of the protective shield 40. The bellows also includes a plurality of parallel folds which permit the bellows to collapse in response to vacuum pressure introduced at the interior of the bellows. The pickup end 52 of the bellows increases in diameter with distance from the handle 12.

The protective shield 40 is fixed to the face 38 of the handle 12 by an externally threaded fastening member 54 having an axial bore 56 extending therethrough. The fastening member is threaded into the internally threaded evacuation opening 36 of the handle 12. When assembled, the axial bore 56 of the fastening member permits fluid communication between the interior of the bellows 44 and the vacuum passageway 16 of the handle.

In operation, the fitting 10 is connected to a vacuum source. During use, the slide valve member 18 is pressed into a position in which air is drawn both from the interior of the bellows 44 and from the vents 30-34. For picking up an electronic component, such as a flatpack, the pickup end 52 of the bellows 44 is pressed against the surface of the component. The user can then block air flow through the vents 30-34 by placement of a finger over the vents. Air will then be drawn from the interior of the bellows 44. Vacuum pressure within the interior of the bellows causes a collapse of the bellows at the folds 50.

The length of the bellows is such that in a relaxed, expanded condition of the bellows, the pickup end 52 extends beyond the protective shield 40. However, as the bellows collapses, the pickup end is drawn into the protective shield. The shield includes a second internal surface 58 which defines a cross-sectional area sufficiently great to accommodate the electronic component. Consequently, in the evacuated, contracted condition, the bellows 44 has carried the component into the shield, so that the leads of the component cannot be bent if the surface mount pick is inadvertently caused to collide with a surrounding structure.

The hand-held pick can be used for surface mounting components. Dowel pins 60 and 62 on the face of the protective shield 40 may be used for properly positioning the components. For example, the dowel pins may be aligned with corresponding holes in a printed circuit board, not shown. Insertion of the dowel pins within the corresponding circuit board holes ensures that the component is properly positioned.

After alignment of the electronic component, the component is extracted from the protective shield by the release of vacuum pressure within the bellows 44. Vacuum pressure is released by removal of the user's finger from blocking the vents 30-34. The area of the venting to the ambient atmosphere is important. Once the vacuum has been formed within the bellows 44, the bellows is more likely to remain in the compressed condition than it is to move to that condition. Thus, ventilation must be sufficiently great to overcome this tendency.

It has been discovered that a single vent having a diameter of 0.125 inch provides sufficient ventilation of the bellows interior to the atmosphere to allow the natural force of the bellows to overcome the vacuum pressure for return of the bellows to an expanded condition. However, the diameter of the 0.125 inch vent could cause skin irritation over a period of time as the vacuum pressure pulls the user's skin into the vent hole. Moreover, often a user wears rubber gloves, and a large diameter hole will tend to pull the glove material into the vent hole. Of even greater concern is the rate of vacuum release. An abrupt release will cause an abrupt movement of the electronic component as the bellows relaxes. This may cause the component to be pressed against a surface with sufficient force to bend the leads or damage the component.

Rather than a single large diameter vent, the handle 12 includes the array of vents 30–34. In operation, the user maintains a finger over each of the vents until the electronic component is properly positioned. The user then slides the finger forwardly or rearwardly to open the vents one at a time so as to slowly release vacuum pressure for a gentle placement of the electronic component. Preferably, the vents are located within an area of one square inch, allowing the user to easily cover all of the vents with a single finger.

Preferably, the handle 12, the protective shield 40 and the bellows 44 are each made of a conductive material. In the handling of integrated circuit chips, a static charge can destroy a chip. Typically, a person handling such components wears a conductive wristband. Constructing the surface mount pick out of conductive materials acts to protect the component.

Figure 4:
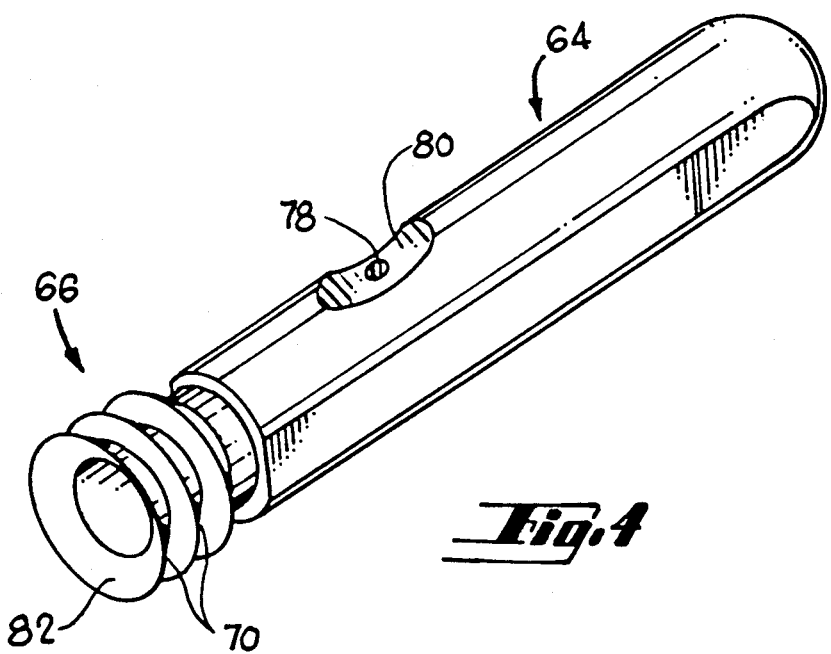
FIG. 4 is a perspective view of a surface mount pick in accord with the present invention.
Figure 5:
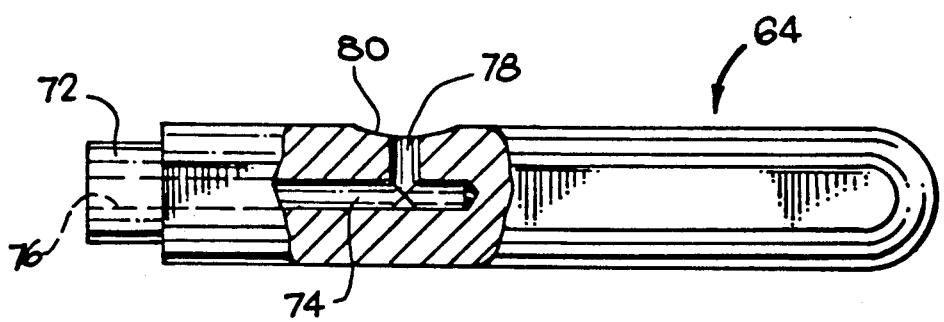
FIG. 5 is a side partially sectional view of the handle of FIG. 4.

A second embodiment of a surface mount pick is shown in FIGS. 4 and 5. This embodiment is limited to a stand-alone handle 64 and a bellows 66. The bellows 66 is identical to the one described above, having an annular end 68 and parallel folds 70 which allow the bellows to collapse. The annular end 68 of the bellows fits snugly to a reduced diameter forward portion 72 of the handle 64.

The handle 64 has a vacuum passageway 74 which extends to an evacuation opening 76 at a forward end. A vent 78 in a recess 80 of the handle allows air flow from the evacuation opening 76 to the atmosphere about the vent.

In operation, an electronic component is secured for movement by pressing a pickup end 82 of the bellows 66 against the component. The compression force causes the bellows 66 to collapse, with the reduction in the volume of the interior of the bellows evacuating air through the vent 78. After collapse of the bellows, a user places a finger over the vent 78. Obstruction of the vent 78 seals the gas passageway 74 to prevent the bellows from expanding to its relaxed condition. Upon reaching a desired destination, the vent is uncovered to allow expansion of the bellows and release of the component.

While the second embodiment of FIGS. 4 and 5 is illustrated as including a single vent 78, preferably the stand-alone pick includes a plurality of vents as in FIG. 1. The array of vents allows a more controlled release of vacuum and a more gentle placement of a component. Moreover, the embodiment of FIGS. 4 and 5 may include the protective shield 40 shown in FIG. 1.

Figure 6:
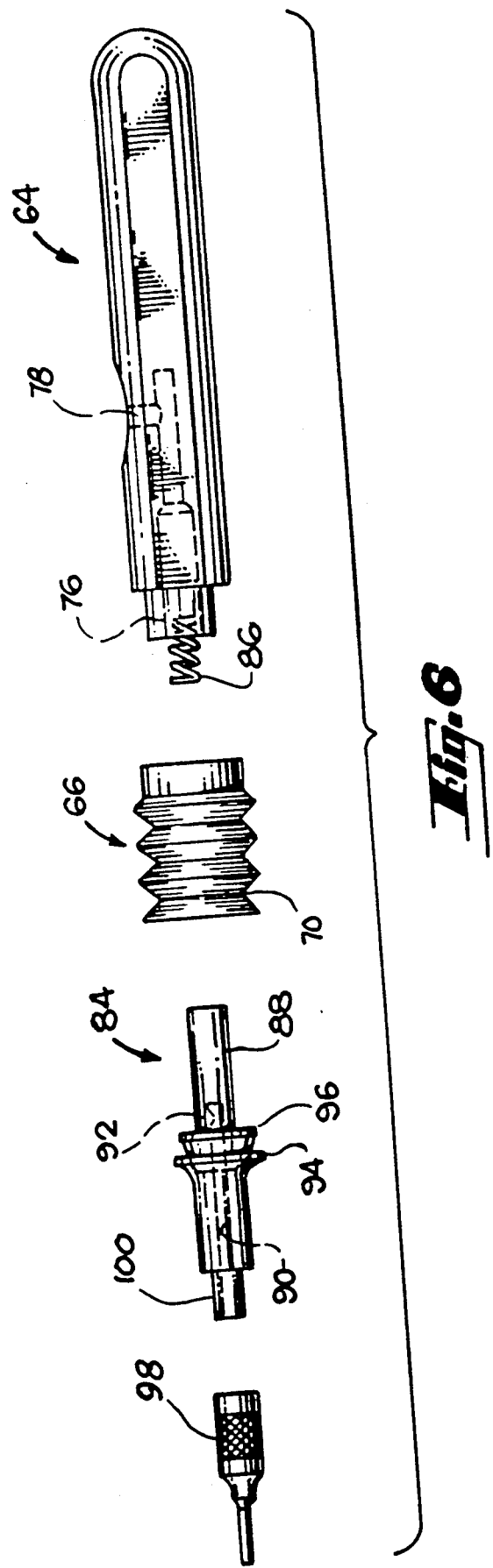
FIG. 6 is an exploded side view of the surface mount pick of FIG. 4 having adapter members.

Referring now FIG. 6, an adapter 84 may be coupled to the bellows 66 to reduce the pickup area for the gripping of small components. The adapter is biased away rfom the handle 64 by a coil spring 86 which contacts a cylindrical portion 88 of the adapter. An axial passageway 90, shown in phantom, at a forward portion of the adapter is in fluid communication with the evacuation opening 76 of the handle via a right-angle bore 92 in the adapter. The adapter is snap-fit to the bellows by pressure sufficient to locate the last fold 70 of the bellows between a pair of flanges 94 and 96 on the adapter. Gripping of miniature components, such as an individual semiconductor die, may be achieved by a friction fit of a needle 98 onto the forward end 100 of the adapter. The needle has a small diameter bore therethrough.

We claim:

1. A hand-held device for transferring electronic components comprising,
   an elongated cylindrical handle member having first and second ends and having a vacuum pasageway, said vacuum passageway having a first opening and a structurally unobstructed array of closely spaced vents to the ambient atmosphere, said array of vents disposed at an intermediate region of said handle member between said first and second ends, said handle member having an inlet means for attachment to a vacuum source, and
   an axially contractible bellows member having a fixed end mounted to said first end of said handle member in fluid communication with said vacuum passageway via said first opening, said bellows member having a reciprocating pickup end axially opposite to said fixed end, said bellows member having a relaxed, expanded condition and an axially contracted condition, the condition of said bellows member being dependent upon the difference in pressure between the ambient atmosphere and said vacuum passageway of said handle member, whereby said bellows member in said contracted condition axially expands upon interruption of vacuum within said vacuum passageway by selective fluid communication with the ambient atmosphere via said array of vents.

2. The device of claim 1 further comprising a shield fixed between said handle member and said bellows member, said shield having an open end, said pickup end of the bellows member being housed within said shield when said bellows member is in said contracted condition, said pickup end extending beyond said shield when said bellows member is in said expanded condition.

3. The device of claim 2 wherein said shield has a projecting region, said fixed end of said bellows member being snug-fit to said projecting region, said projecting region having a bore therethrough in fluid communication with said vacuum passageway.

4. The device of claim 3 wherein said shield is fixed to said handle member by an externally threaded fastening member received within said bore of said shield, said fastening member having an axial passageway therethrough.

5. The device of claim 1 further comprising a valve means for selectively isolating a first portion of said vacuum passageway from a second portion, said first portion being at said inlet means.

6. The device of claim 1 wherein said pickup end is flared.

7. The device of claim 1 further comprising a needle member coupled to said pickup end of said bellows member, said needle member having a narrow opening at an end distal said handle member, said narrow opening being in fluid communication with said vacuum passageway via said bellows member.

8. A hand-held device for picking up electronic components comprising,
   an elongated handle having a vacuum passageaway and having attaching means for connecting said vacuum passageway to a vacuum source, said handle having an evacuation opening at a first end and having an array of closely spaced vents to the ambient atmosphere, said events being on an exterior surface of said handle and being disposed within an area not exceeding one square inch, said evacuation opening and said vents being spaced apart from said attaching means and being in fluid communication via said vacuum passageway, and
   a resiliently contractible bellows coupled to the said first end of said handle, said bellows being biased into an expanded condition and having an evacuated contracted condition, said bellows being in fluid communication with said evacuation opening.

9. The device of claim 8 wherein said attaching means is a fitting at a second end of said handle opposite to said first end.

10. The device of claim 8 further comprising a shield attached to said handle at said first end, said bellows having a pickup region opposite to said handle and having a fixed region housed within said shield, said pickup region extending beyond said shield when said bellows is in said expanded condition and being housed within said shield when said bellows is in said evacuated contracted condition.

11. The device of claim 10 wherein said shield has a cubic shape.

12. The device of claim 8 wherein said handle includes a valve means for selectively sealing said vacuum source from said evacuation opening.

13. The device of claim 8 wherein said bellows is generally cylindrical.

14. A device for picking up electronic components comprising,
   a generally cylindrical handle having an evacuation hole at a first end and having a plurality of closely spaced vents along an intermediate region, said evacuation hole being in fluid communication with said vents via a vacuum passageway in said handle,
   attaching means for connecting said handle to a source of vaccum in a manner to evacuate gas from said vacuum passageway, said attaching means being spaced apart from said evacuation hole and said vents,
   a collapsible bellows having a plurality of folds, said bellows having an evacuated collapsed condition and an expanded condition, said bellows coupled to said handle in fluid communication with said vacuum passageway via said evacuation hole, and
   a protective shield coupled to said handle at said first end, said shield having an open end, said bellows being received within said open end when in said evacuated collapsed condition.

15. The device of claim 13 wherein said bellows is generally cylindrical.

16. The device of claim 13 wherein a portion of said bellows extends beyond said shield when said bellows is in said expanded condition.

17. The device of claim 13 wherein said shield is generally cubic.

18. The device of claim 13 wherein said bellows and handle are electrically conductive.

* * * * *

UNITED STATES PATENT AND TRADEMARK OFFICE
CERTIFICATE OF CORRECTION

PATENT NO. : 5,118,153
DATED : June 2, 1992
INVENTOR(S) : Quincy D. Allison et al.

It is certified that error appears in the above-identified patent and that said Letters Patent is hereby corrected as shown below:

Column 5, line 66, "Referring now Fig. 6" should read
 - -Referring now to Fig. 6- -.

Column 6, line 1, "away rfom" should read - -away from- -.

Claim 8, column 7, line 10, "said events being" should read
 - -said vents being- -.

Claim 15, column 8, line 27, "The device of claim 13" should read
 - -The device of claim 14- -.

Claim 16, column 8, line 29, "The device of claim 13" should read
 - -The device of claim 14- -.

Claim 17, column 8, line 32, "The device of claim 13" should read
 - -The device of claim 14- -.

Claim 18, column 8, line 34, "The device of claim 13" should read
 - -The device of claim 14- -.

Signed and Sealed this

Thirty-first Day of August, 1993

*Attest:*

BRUCE LEHMAN

*Attesting Officer*     *Commissioner of Patents and Trademarks*